United States Patent
Zortea

(10) Patent No.: US 7,161,523 B1
(45) Date of Patent: Jan. 9, 2007

(54) SYSTEMS AND METHODS FOR A SELF-ORGANIZING ANALOG-TO-DIGITAL CONVERTER

(75) Inventor: Anthony Eugene Zortea, Pipersville, PA (US)

(73) Assignee: PMC-Sierra, Inc., Santa Clara, CA (US)

( * ) Notice: Subject to any disclaimer, the term of this patent is extended or adjusted under 35 U.S.C. 154(b) by 0 days.

(21) Appl. No.: 11/219,417

(22) Filed: Sep. 2, 2005

Related U.S. Application Data

(60) Provisional application No. 60/607,146, filed on Sep. 3, 2004.

(51) Int. Cl.
*H03M 1/12* (2006.01)
(52) U.S. Cl. ..................... 341/158; 341/120
(58) Field of Classification Search ............. 341/158, 341/159, 160
See application file for complete search history.

(56) References Cited

U.S. PATENT DOCUMENTS

| | | | |
|---|---|---|---|
| 4,884,075 A | | 11/1989 | Mangelsdorf |
| 5,420,587 A | * | 5/1995 | Michel ................ 341/156 |
| 5,451,952 A | * | 9/1995 | Yamazaki et al. ......... 341/158 |
| 5,696,508 A | | 12/1997 | Gross, Jr. et al. |
| 5,990,814 A | | 11/1999 | Croman et al. |
| 6,252,454 B1 | | 6/2001 | Thompson et al. |
| 6,373,423 B1 | * | 4/2002 | Knudsen ............. 341/159 |
| 6,778,110 B1 | * | 8/2004 | Jansson ............. 341/120 |
| 2004/0169597 A1 | * | 9/2004 | Mulder et al. ........ 341/158 |
| 2005/0128118 A1 | * | 6/2005 | Devendorf et al. ...... 341/158 |
| 2005/0168370 A1 | * | 8/2005 | Mokhtari et al. ........ 341/158 |

OTHER PUBLICATIONS

Sugawara, M. et al., A 2.5 V 100 MS/s 8 bit ADC using Pre-Linearization Input Buffer and Level Up DAC/Subtractor, 1998 Symposium on VLSI Circuits, Digest of Technical Papers, Jun. 11-13, 1998, pp. 170-173.*

Brian P. Brandt and Joseph Lutsky, "A 75-mW, 10-b, 20-MSPS CMOS Subranging ADC with 9.5 Effective Bits at Nyquist," IEEE Journal of Solid-State Circuits, vol. 34, No. 12, Dec. 1999, pp. 1788-1795.

Michael P. Flynn, Conor Donovan, Linda Sattler, "Digital Calibration Incorporating Redundancy of Flash ADCs," IEEE Transactions on Circuits and Systems—II: Analog and Digital Signal Processing, vol. 50, No. 5, May 2003, pp. 205-213.

Lalitkumar Y. Nathawad, Ryohei Urata, Bruce A. Wooley, and David A. B. Miller, "A 40-GHz-Bandwidth, 4-Bit, Time-Interleaved A/D Converter Using Photoconductive Sampling," IEEE Journal of Solid-State Circuits, vol. 38, No. 12, Dec. 2003, pp. 2021-2030.

Walt Kester, AN-215A Application Note: Designer's Guide to Flash-ADC Testing, Part 1 Flash ADCs Provide the Basis for High Speed Conversion, Reprinted from EDN—Jan. 4, 1990, Analog Devices [online]. Retrieved from the Internet: <URL: http://www.analog.com/UploadedFiles/Application—Notes/38148515862956AN215A.pdf>, pp. 3-71 to 3-78.

(Continued)

*Primary Examiner*—Howard L. Williams
(74) *Attorney, Agent, or Firm*—Knobbe Martens Olson & Bear LLP

(57) ABSTRACT

An apparatus uses a "self-organizing" method to eliminate or at least partially compensate for undesired or unexpected threshold errors encountered in analog-to-digital conversions. The self-organizing feature results in a relatively good, such as an optimal, spacing of a plurality of comparator thresholds even in the presence of relatively large comparator offsets, reference offsets, or other system offsets. Advantageously, the self-organizing techniques can be used without a special starting point for the thresholds. The self-organizing techniques can be used applied to at least portions of any analog-to-digital converter ADC that uses comparators, such as flash ADCs, pipeline ADCs, and subranging ADCs.

32 Claims, 9 Drawing Sheets

OTHER PUBLICATIONS

Walt Kester, AN-215B Application Note: Designer's Guide to Flash-ADC Testing, Part 2 DSP Test Techniques Keep Flash ADCs In Check, Reprinted from EDN—Jan. 18, 1990, Analog Devices [online]. Retrieved from the Internet: <URL: http://www.analog.com/UploadedFiles/Application—Notes/39107601403760AN215B.pdf>, pp. 3-79 to 3-84.

Walt Kester, AN-215C Application Note: Designers's Guide to Flash-ADC Testing, Part 3 Measure Flash-ADC Performance for Trouble-Free Operation, Reprinted from EDN—Feb. 1, 1990, Analog Devices [online]. Retrieved from the Internet: <URL: http://www.analog.com/UploadedFiles/Application—Notes/39221842023480AN215C.pdf>, pp. 3-85 to 3-93.

* cited by examiner

SYSTEMS AND METHODS FOR A SELF-ORGANIZING ANALOG-TO-DIGITAL CONVERTER

CROSS-REFERENCE TO RELATED APPLICATIONS

This application claims the benefit under 35 U.S.C. § 119(e) of U.S. Provisional Application No. 60/607,146, filed Sep. 3, 2004, the entirety of which is hereby incorporated by reference.

BACKGROUND

1. Field of the Invention

The invention generally relates to electronic circuits, and in particular, to circuits using analog-to-digital converters.

2. Description of the Related Art

An analog-to-digital converter (ADC) converts an analog signal to a digital signal. ADCs are commonly found where there is an interface with the physical world, e.g., sound, images, or in data communications where an analog signal from a cable or wireless media is digitized to be further processed or stored. Accordingly, ADCs are used in a wide variety of applications, such as data capture, data communications, hard disks, video capture, audio sampling, radar signal processing, and the like. These ADCs can be standalone, can be combined with other circuits on an integrated circuit, such as combined with a microprocessor or a digital signal processor, and can be part of a larger system, such as part of a satellite receiver, broadband network modem, phone modem, hard disk, network communication device, and the like.

A wide variety of architectures exist for an ADC. Some types of ADCs use comparator banks to convert from analog to digital. These types using comparators include Flash converters, which are also known as direct conversion ADCs. Sub-ranging converters also use comparators in the conversion process.

For example, in a Flash ADC, the conversion is accomplished by comparing an input signal to a set of threshold voltages, such as from a resistor ladder, and then establishing a digital value based on the results of the comparisons. In one example, the output of each individual comparison can assume one of two states: "1" or "0." For example, in one arrangement, the output of the comparator is a logic "1" if the input signal is greater than the threshold and is a logic "0" otherwise. The comparator outputs are combined to form a digital word output.

In a linear ADC, it is typically desirable for the set of thresholds to be relatively evenly spaced so that there is a relatively linear relationship between the analog input and the digital output. Often, there are relatively many comparators for which a threshold is adjusted. The adjustment of a threshold to account for imperfections in the process or design for a comparator is often referred to as "trimming" the comparator.

The adjustment of thresholds of a comparator bank can be time consuming, costly, imperfect, and inconvenient. Often, the analog-to-conversion process of a signal is suspended in order to perform a calibration process. The number of comparators to be adjusted or trimmed can be relatively high and can vary with the number of output bits of the ADC. For N output bits, $2^N-1$ comparators are used in a Flash ADC for the detection of voltage levels. For example, in a Flash ADC with 8 binary output bits, 255 comparators are used in the comparator bank for the detection of voltage levels. In a sub-ranging ADC, the number of comparators will typically be fewer than in the Flash ADC.

FIG. 1 illustrates an example of a relatively linear mapping of an analog input to a digital output. Relatively good linearity is indicated by relatively evenly spaced thresholds along the horizontal axis, that is, thresholds $thr_i$ are evenly spaced such that the relationship expressed in Equation 1 at least approximately holds.

$$|thr_i - thr_{i-1}| = |thr_i - thr_{i+1}| \qquad \text{Equation 1}$$

FIG. 2 illustrates an example of a relatively non-linear mapping of an analog input to a digital output. Relatively poor linearity is indicated by relatively unevenly spaced threshold along the horizontal axis of FIG. 2 such that the relationship expressed in Equation 2 holds, where $o_i$ indicates an offset associated with a threshold $thr_i$.

$$|(thr_i + o_i) - (thr_{i-1} + o_{i-1})| \neq |(thr_i + o_i) - (thr_{i+1} + o_{i+1})| \qquad \text{Equation 2}$$

One common source for the offset $o_i$ is a device mismatch or a component mismatch in the embodying integrated circuit. In a non-linear ADC, the thresholds are unevenly spaced and the digital output signal is distorted with respect to the analog input signal. This distortion can be quantified by parameters such as "effective number of bits (ENOB)," or "integral non-linearity (INL)," or "differential non-linearity (DNL)," or other parameters.

FIG. 3 illustrates a conventional trimming circuit for a Flash ADC. With conventional techniques, the analog input is switched using a multiplexer to a special signal from a calibration signal generator, and a calibration circuit adjusts the trim for the comparators.

One disadvantage to this trimming technique is that the linearity required of the calibration signal generator is relatively high and should exceed the linearity that is expected of the ADC. Accordingly, the calibration signal generator is typically relatively expensive to manufacture. Another disadvantage is that while the input to the ADC is switched to the special signal, the ADC is not able to perform an analog-to-digital conversion of the analog input, which decreases the availability of the ADC to do useful work.

SUMMARY

An apparatus uses a "self-organizing" technique to eliminate or at least partially compensate for undesired or unexpected threshold errors encountered in analog-to-digital conversions. This feature can be used to adjust or trim comparator thresholds "on the fly," that is, while an analog-to-digital converter is performing a conversion of data, which permits the analog-to-digital converter to be available more often to convert data. In addition to special calibration signals, analog signals to be converted to digital data are also compatible with the adjustment technique, which advantageously eliminates the need for calibration signal generators. Such techniques can be used to reduce the cost of an analog-to-digital converter by, for example, permitting a less expensive voltage reference ladder to be used.

One embodiment is an apparatus for adjusting a comparison, where the apparatus includes: an arrangement of comparators in a thermometer-code configuration, the comparators being configured to receive an analog signal, at least a portion of outputs of comparators carrying a first digital form of the analog signal; logic circuits configured to make a determination when the analog signal is between levels detected by logically adjacent comparators of the comparator arrangement; and a circuit configured to adjust a threshold voltage of at least one of the adjacent comparators at least partially in response to the determination by said logic circuit. The logically adjacent comparators need not be physically adjacent on an integrated circuit.

One embodiment is an apparatus for converting an analog input signal to digital, where the apparatus includes: a plurality of comparators comprising at least a first comparator, a second comparator, and a third comparator, where one or more of the comparators including at least the second comparator is configured to provide a signal for an analog-to-digital conversion, where each comparator of the plurality has a first input coupled to a voltage reference specific for the comparator and has a second input coupled to an analog signal based at least partially on the analog input signal; a first logic circuit having a first input, a second input, and an output, where the first input is coupled to an output of the first comparator, the second input is coupled to an output of the second comparator, and the output of the first logic circuit is at least partially responsive to a logical combination of the first input and the second input; a second logic circuit having a first input, a second input, and an output, where the first input is coupled to an output of the second comparator, the second input is coupled to an output of the third comparator, and the output of the second logic circuit is at least partially responsive to a logical combination of the first input and the second input; and one or more adjustment circuits for the one or more comparators of the plurality that are configured to provide a signal, the one or more adjustment circuits including at least a first adjustment circuit configured to decrease a threshold of comparison of the second comparator in response to activation at a first input, where the first adjustment circuit is configured to increase the threshold of comparison in response to activation at a second input, and where the first input and the second input are coupled to the first logic circuit and to the second logic circuit, respectively, for activation.

One embodiment is a method of adjusting threshold of a comparator, where the method includes: converting an input signal from analog to digital with a plurality of comparators arranged in a thermometer-code configuration; using the analog signal to be converted as an input signal calibration of at least a portion of the comparators; determining when the analog signal is between levels detected by adjacent comparators of the comparator arrangement; and adjusting a threshold voltage of at least one of the adjacent comparators at least partially in response to the determination.

One embodiment is a method of calibrating a threshold of a comparator of an analog-to-digital conversion, where the method includes: comparing an analog signal to a first reference; comparing the analog signal to a second reference; comparing the analog signal to a third reference; adjusting the comparison of the analog signal and the second reference such that the second reference is effectively higher for a subsequent comparison at least partially in response to a determination that the analog signal is lower than the third reference and is higher than the second reference; adjusting the comparison of the analog signal and the second reference such that the second reference is effectively lower for a subsequent comparison at least partially in response to a determination that the analog signal is lower than the second reference and is higher than the first reference; generating data for the analog-to-digital conversion with at least the comparison of the analog signal with the second reference; and performing the method in real time.

One embodiment is a method of adjusting a threshold of a comparator used in an analog-to-digital conversion, where the method includes: comparing the analog signal to a first reference; comparing the analog signal to a second reference, where the second reference is higher than the first reference; comparing the analog signal to a third reference, where the third reference is higher than the second reference; adjusting the comparison of the analog signal and the second reference such that the second reference is effectively higher for a subsequent comparison at least partially in response to determining that a comparison result using the third reference is different than a comparison result using the second reference; adjusting the comparison of the analog signal and the second reference such that the second reference is effectively lower for a subsequent comparison at least partially in response to determining that a comparison result using the second reference is different than a comparison result using the first reference; using at least the comparison of the analog signal with the second reference to generate data for the analog-to-digital conversion; and performing the method in one or more electronic circuits.

One embodiment is a method including converting an analog signal to a thermometer code, calibrating the conversion to thermometer code with the thermometer code, and generating a binary output from a smaller subset of the thermometer code.

One embodiment is an apparatus for adjusting a comparison in an analog-to-digital converter, where the apparatus includes: a plurality of comparators arranged in a thermometer-code configuration to convert an input signal from analog to digital; means for using the analog signal to be converted as an input signal for adjustment of thresholds of at least a portion of the comparators; means for determining when the analog signal is between levels detected by adjacent comparators of the comparator arrangement; and means for adjusting a threshold voltage of at least one of the adjacent comparators at least partially in response to the determination.

BRIEF DESCRIPTION OF THE DRAWINGS

These drawings and the associated description herein are provided to illustrate specific embodiments of the invention and are not intended to be limiting.

DETAILED DESCRIPTION OF SPECIFIC EMBODIMENTS

Although particular embodiments are described herein, other embodiments of the invention, including embodiments that do not provide all of the benefits and features set forth herein, will be apparent to those of ordinary skill in the art.

Advantages to embodiments of the invention include a reduction in power consumed and the amount of silicon area used by an associated integrated circuit. For example, the circuits embodying the adjustment techniques or self-organizing techniques occupy relatively little chip area compared to some configurations of voltage references such as precise resistor ladders. This permits the use of relatively more crude voltage references, which decreases the overall size and cost of an integrated circuit using the self-organizing techniques and can reduce or eliminate the need to trim resistors of a resistor ladder during production.

Figure 4:
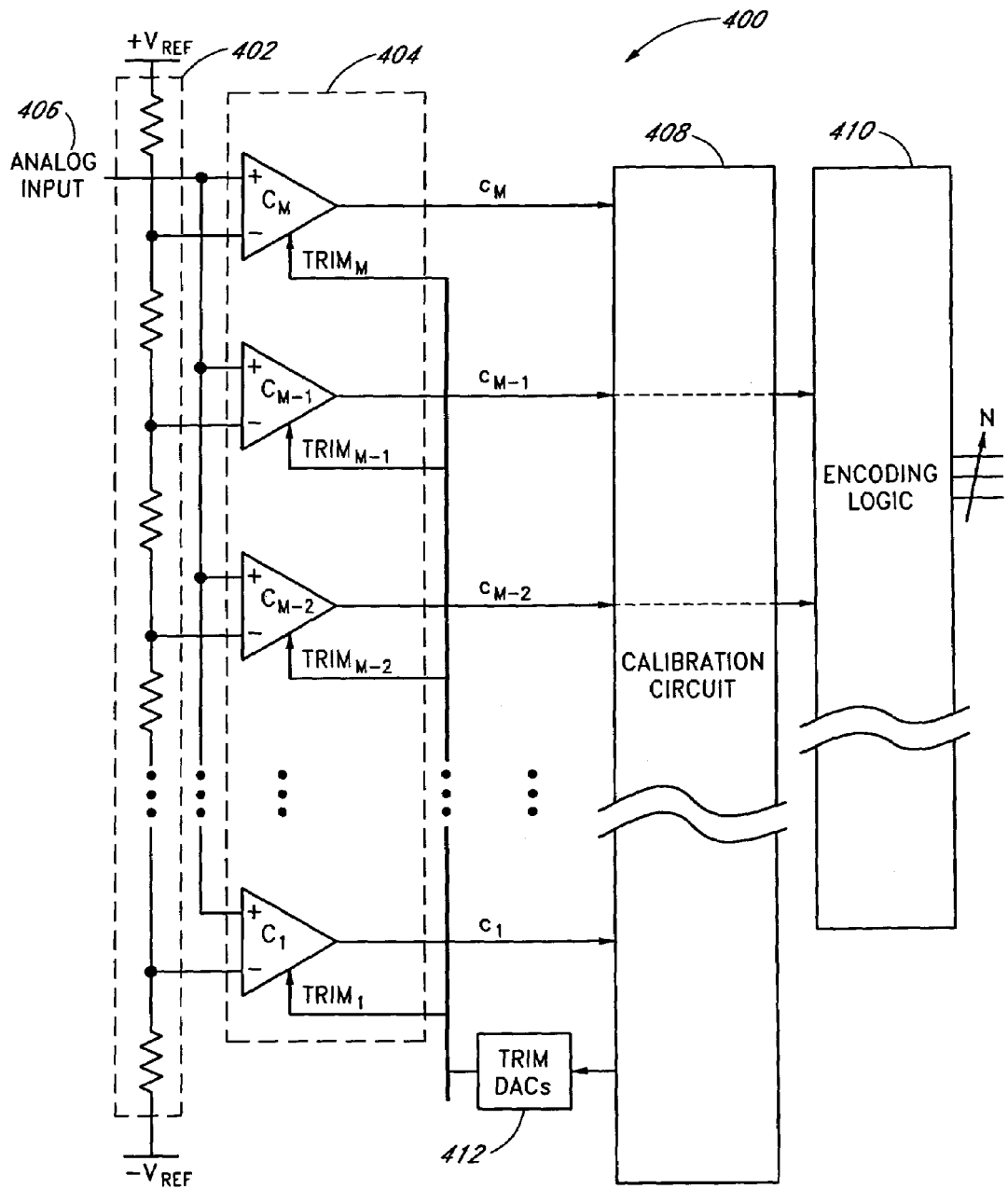
FIG. 4 illustrates an example of a Flash ADC according to an embodiment of the invention.

FIG. 4 illustrates a Flash ADC 400 according to an embodiment of the invention. The illustrated embodiment uses a generalized M number of comparators. Embodiments with specific numbers of comparators will be described in greater detail later in connection with FIGS. 6A and 6B. In one embodiment, the Flash ADC 400 is embodied in an integrated circuit. The Flash ADC 400 can be standalone, can be integrated with other components, such as control circuits, microprocessors, digital signal processors, and the like. The Flash ADC 400 can be incorporated in a wide variety devices, such as, but not limited to satellite receivers, modems, hard disks, network communication devices, and the like.

The illustrated Flash ADC 400 includes a voltage reference circuit 402, embodied as a resistor ladder, a bank of M comparators 404 coupled to the voltage reference circuit 402 and to an analog input 406, a calibration circuit 408, encoding logic 410, and trim digital-to-analog converters (DACS) 412. For clarity, timing circuits, latches, glue logic, and the like are not shown.

The analog input 406 indicates the signal which is to be converted to digital. It will be understood that additional circuits can be used with the analog input 406, such as, but not limited to, buffering circuits, tracking or sampling circuits, and the like. The voltage reference circuit 402 provides voltage references for the comparators. With the ladder tree illustrated in FIG. 4, the voltage references provided by the voltage reference circuit 402 will typically be monotonic. However, as will be described later in connection with FIGS. 5A and 5B, monotonicity is not required for the calibration technique to function. After calibration, the output of the comparator bank 404 should be monotonic according to the intended logical order of the comparators. When monotonic, the output of the comparator bank 404 corresponds to a thermometer code, which is provided as an input to the calibration circuit 408 and to the encoding logic 410. With a thermometer code, the outputs are normally logical zeroes on outputs of comparators with thresholds above the level of the analog input 406 and are normally logical ones on outputs of comparators with thresholds below the level of the analog input 406. For example, if there are 8 comparators in a thermometer-code arrangement, the outputs will normally look like {00000000}, {00000001}, {00000011}, {00000111}, {00001111}, and so on. In the illustrated embodiment, the outputs of all M of the comparators of the comparator bank 404 are used by the calibration circuit 408, and the output of only selected comparators are used for the encoding logic 410.

The encoding logic 410 converts the thermometer code of the comparator bank 404 to a desired data format, which is typically binary. For example, the encoding logic can correspond to a priority encoder. For example, in the illustrated embodiment, the M−2 innermost comparators of the comparator bank 404 provide the thermometer code to be encoded into N binary data bits. For N binary output bits, there are typically $2^N-1$ comparators providing thermometer code data to be encoded. Accordingly, in the illustrated embodiment, the value of M is typically $2^N+1$. It should be noted that this value for M can vary, and additional comparators can be included.

Operation of the calibration circuit 408 can be expressed by Equation 3.

$$\text{if } (\bar{c}_{j+1} \cdot c_j) \Rightarrow (\text{trim}_j +\!\!= \partial, \text{trim}_{j+1} -\!\!= \partial) \quad \text{Equation 3}$$

For example, after an analog-to-digital conversion, if the input signal falls between comparator j and comparator j+1 (in the thermometer code), the technique increases the threshold of comparator j, decreases the threshold of comparator j+1, and leaves the thresholds of other comparators as they were. The increase and decrease of the threshold can be implemented with an up/down counter and a digital-to-analog converter (DAC). Other techniques can also apply and will be discussed later.

The calibration circuit 408 determines if the input signal falls between two comparators by examining their digital outputs $c_j$. When $c_j$ is a logical "1" and $c_{j+1}$ is a logical 0, the input signal is between comparator j and comparator j+1. To increase or decrease the threshold of a comparator, the calibration circuit 408 can increase or decrease the trim value $\text{trim}_j$ provided by the appropriate trim DAC of the trim DACs 412. For example, a four-bit or five-bit DAC will suffice for most applications.

Other techniques can be used to adjust the thresholds. For example, rather than use a trim DAC, analog circuits and charge pumps can be used to generate a trim voltage. In another example, rather than a DAC, the transistors within the comparators can be switched to provide a predetermined amount of threshold adjustment. For example, these transistors can be binary weighted. In another example, rather than using a counter in the calibration circuit, a shift register can be used to shift ones or zeroes left and right instead of counting up and down. The shift register can be coupled to transistors within the comparators to adjust the threshold. Other techniques for adjusting a threshold or trimming a comparator will be readily determined by one of ordinary skill in the art.

Figure 1:
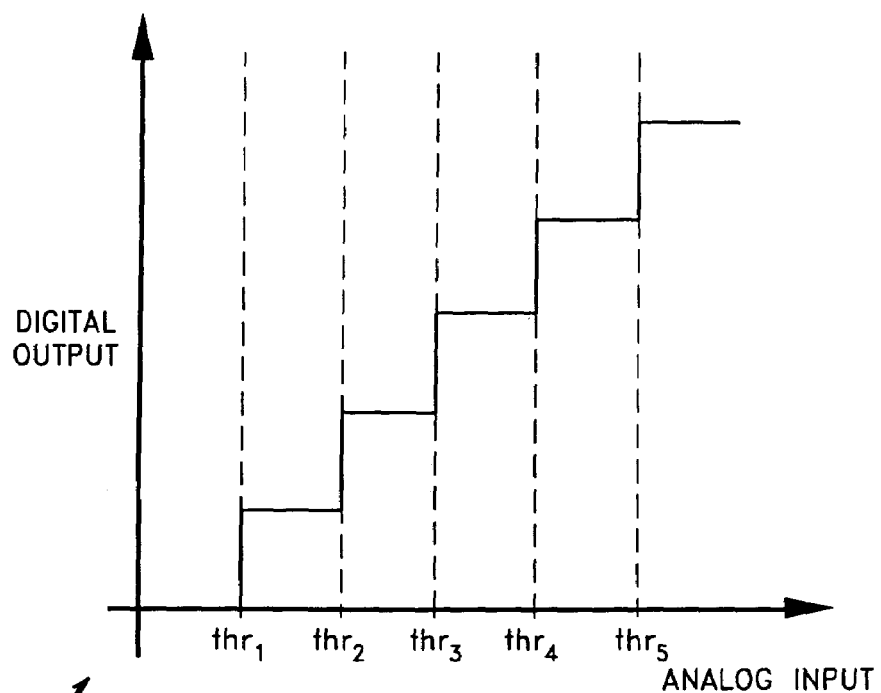
FIG. 1 illustrates an example of a relatively linear mapping of an analog input to a digital output.
Figure 2:
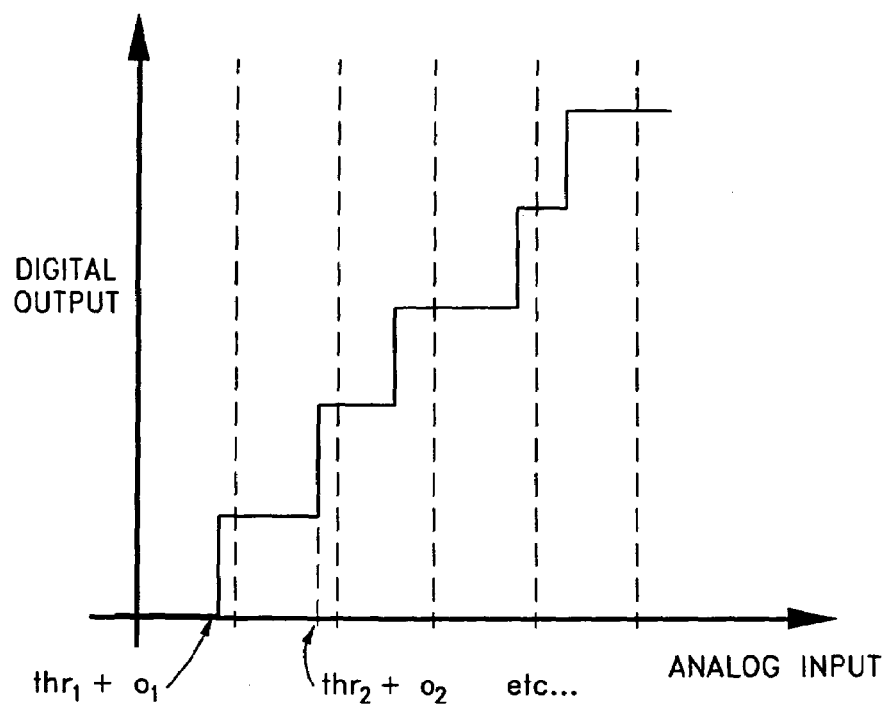
FIG. 2 illustrates an example of a relatively non-linear mapping of an analog input to a digital output.
Figure 3:
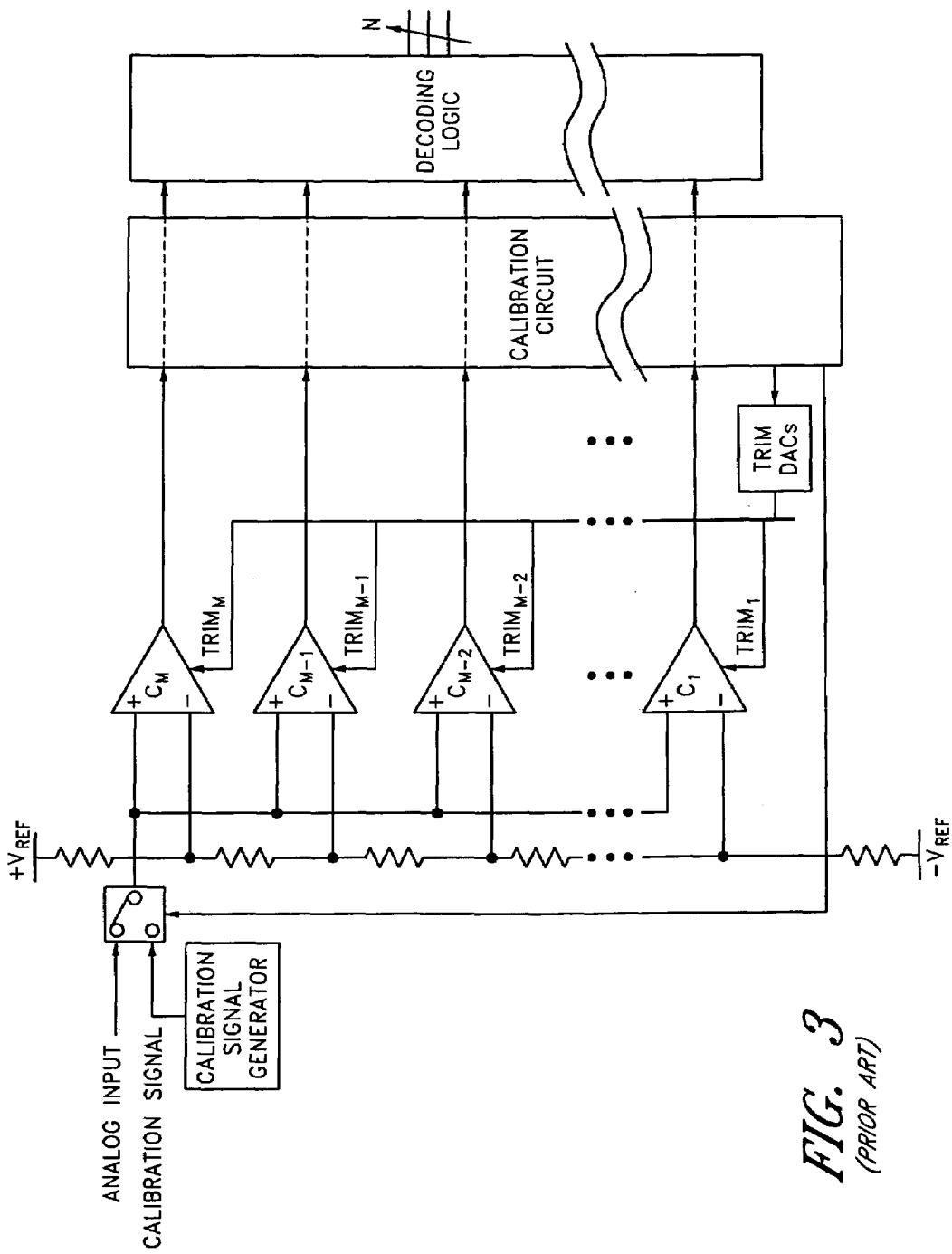
FIG. 3 illustrates a conventional trimming circuit for a Flash ADC.
Figure 5B:
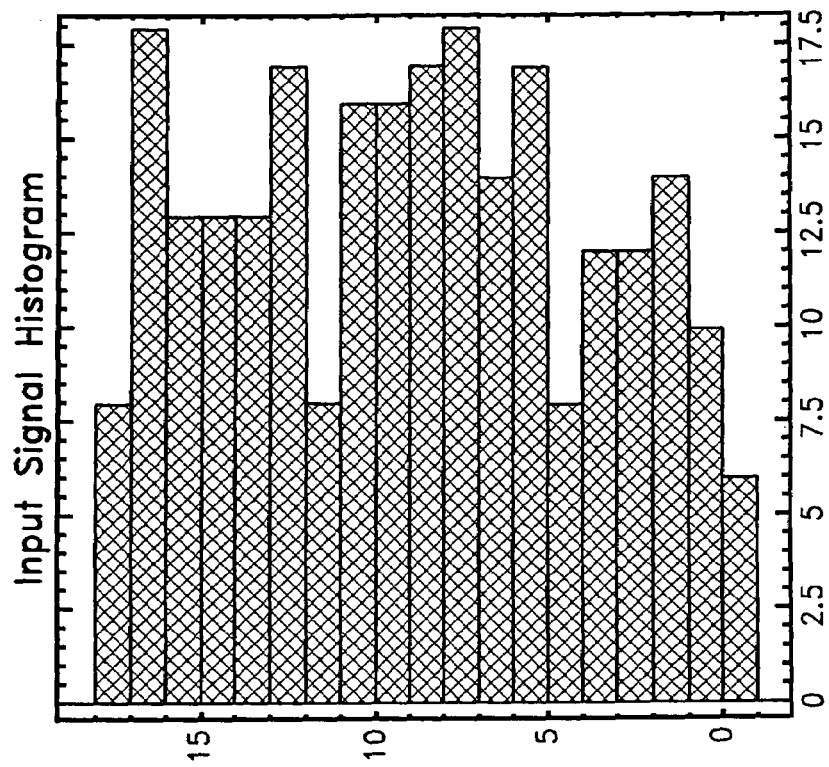
FIG. 5B illustrates a sample histogram of data for the input signal used in the simulation of FIG. 5A.
Figure 5A:
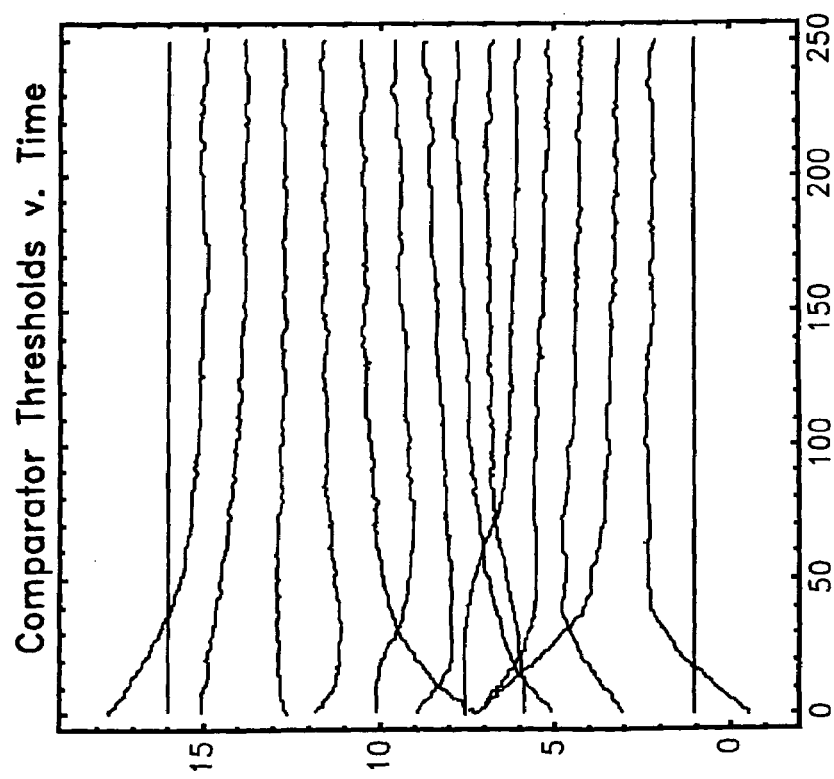
FIG. 5A illustrates a simulation of voltage references with threshold adjustment as the voltages are being adjusted by the self-organizing technique.

FIG. 5A illustrates a simulation of voltage references with threshold adjustment as the voltages are being adjusted by the self-organizing technique. The simulation is based on the technique expressed by FIG. 3. In a vertical axis, the simulation illustrates a voltage where each comparator switches with the combination of the reference voltage and the threshold adjustment. Advantageously, the simulation illustrates that no particular starting point is required for the voltage references and that the references do not even need to be monotonic at the start.

Time is shown along the horizontal axis, with time increasing to the right. Initially, there is no particular threshold adjustment applied to the comparators. As time increases to the right, the effect of the threshold adjustment can be observed. As time passes, the thresholds can be observed to space relatively evenly along the vertical axis, indicating relatively good linearity.

In the illustrated self-organizing technique, the thresholds for the comparators at the extremes for the comparator bank (highest voltage and lowest voltage) are not adjusted. Accordingly, the corresponding reference lines remain flat in FIG. 5A.

Solely for the purposes of illustration and simulation, 16 lines corresponding to 16 comparators are illustrated in FIG. 5A. Of course, the number of actual comparator thresholds will vary with the number of output bits. For example, with 4 output bits of a Flash ADC, 15 comparators will typically be used for data, and 17 total comparators will be used for the calibration.

FIG. 5B illustrates a sample histogram of data for the simulated input signal used in the simulation of FIG. 5A. The 19 histogram bins illustrate a relatively extreme case over which the input signal was fluctuated for the simulation of FIG. 5A. It will be appreciated that the probability density function for the input signal should be somewhat uniform as illustrated in FIG. 5B, and that the self-organizing techniques work better the more uniform the input signal is. Of course, if the input signal is not uniform at all, a multiplexer circuit can be used to switch to a calibration signal for use with the self-organizing technique.

Figure 6A:
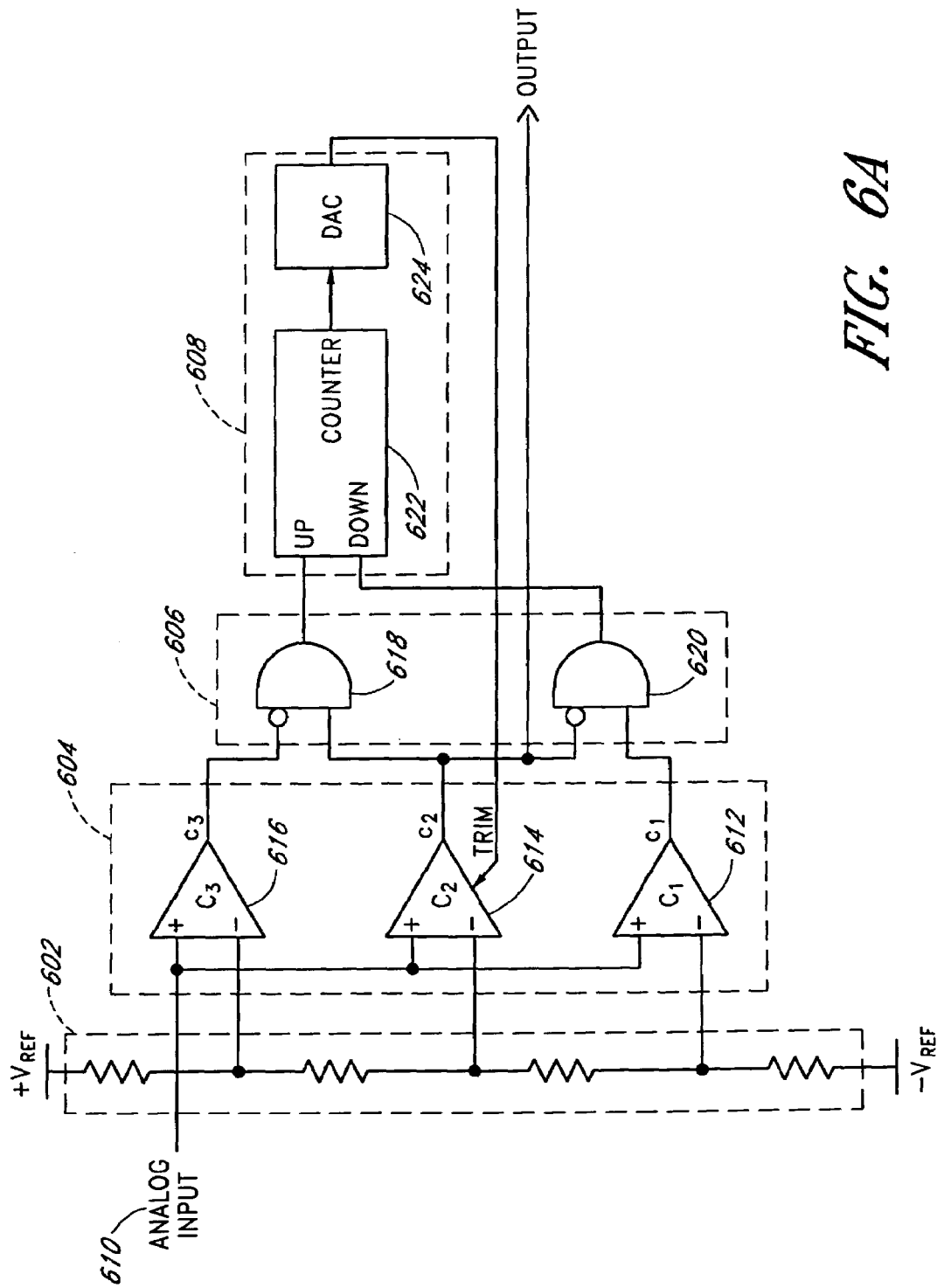
FIG. 6A illustrates an example of a 1-bit ADC according to an embodiment of the invention.

FIG. 6A illustrates an example of a 1-bit ADC according to an embodiment of the invention. A 2-bit ADC and a general N-bit ADC will be described later in connection with FIGS. 6B and 6C. The 1-bit ADC includes a voltage reference circuit 602, a comparator bank 604, logic gates 606 for steering of the adjustments, and a trim adjusting circuit 608.

An analog input 610 is provided as an input to each of the comparators 612, 614, 616 in the comparator bank 604. In the illustrated embodiment, the analog input 610 is coupled to the non-inverting inputs, and the inverting inputs of the comparators 612, 614, 616 are coupled to respective references from the voltage reference circuit 602. The voltage reference circuit 602 is configured such that the voltage reference for the comparator C2 614 is typically higher than the voltage reference for the comparator C1 612, and such that the voltage reference for the comparator C3 616 is typically higher than the voltage reference for the comparator C2 614. Accordingly, the output of the comparator bank 604 captures the analog input 610 in thermometer code, i.e., the outputs of the comparators C3 616, C2 614, and C1 612, denoted c3, c2, and c1, respectively, vary from {000}, to {001}, to {011}, and to {111} as the analog input 610 rises.

In a 1-bit implementation, the output of the comparator C2 614 is used for data, and the outputs of comparators C1 612, C2 614, and C3 616 are used to adjust or trim comparator C2 614. Consistent with the operation of the calibration circuit 408 expressed in Equation 3, the logic gates 606 and the trim adjusting circuit 608 adjust the threshold for comparator C2 614 as follows. When the voltage of the analog input 610 is determined to be between the threshold levels for comparator C2 614 and comparator 616, which results in a thermometer code of {011}, the trim for the comparator C2 614 is adjusted such that the threshold level for the comparator C2 614 is increased. When the voltage of the analog input 610 is determined to be between the threshold levels for comparator C2 614 and the comparator C1 612, which results in a thermometer code of {001}, the trim for the comparator C2 614 is adjusted such that the threshold level for the comparator C2 614 is decreased.

The logic gates 606 and the trim-adjusting circuit 608 illustrate one example of implementing the trim adjustment. The illustrated logic gates 606 correspond to AND gates 618, 620 having one inverting input and one non-inverting input. For example, the output of the upper AND gate 618 is a high when c3 is low and c2 is high, and the output is low otherwise. The output of the lower AND gate 620 is a high when c2 is high and c1 is low, and the output is low otherwise. In the illustrated embodiment, the trim adjusting circuit 608 includes an up/down counter 622 and a digital-to-analog converter (DAC) 624. When the condition monitored by the upper AND gate 618 is determined, the up/down counter 622 counts up. When the condition monitored by the lower AND gate 620 is determined, the up/down counter 622 counts down. The count or output of the up/down counter 622 is provided as an input to the DAC 624. The voltage output of the DAC 624 accordingly varies with the count of the up/down counter 622. The up/down counter 622 is one example of a digital filter.

In another embodiment, exclusive-OR (XOR) gates are used instead of the inverting-input/non-inverting input AND gates for the logic gates 606. When XOR gates are used, the voltage reference circuit 602 should be monotonic. Other applicable logic circuits will be readily determined by one of ordinary skill in the art.

While illustrated with an up/down counter and a DAC, various other implementations for the trim-adjusting circuit 608 exist. For example, the trim-adjusting circuit 608 can be implemented by an analog filter circuit and a charge pump. The circuit can increase or decrease stored charge on a capacitor, and the resulting voltage change on the capacitor is used to adjust or trim the corresponding comparator. In another example, the comparator can include transistors configured to adjust the threshold of the comparator, and the output of the counter can be coupled as a control to these transistors. In another example, a shift register can be used in place of the up/down counter, by, for example, shifting in ones and zeroes depending on whether an increase or a decrease in the threshold level is desired. The output of the shift register could then be coupled to the comparator for control of the trim. Other embodiments will be readily determined by one of ordinary skill in the art.

It will be understood that the drawing illustrates the logical relationships among the various blocks. The circuit can be drawn in other ways without departing from the scope of the invention. For example, the output of the comparators can be inverted, or can have both inverted and non-inverted outputs (differential). This would, for example, eliminate the inversion at the input of the AND gates.

Figure 6B:
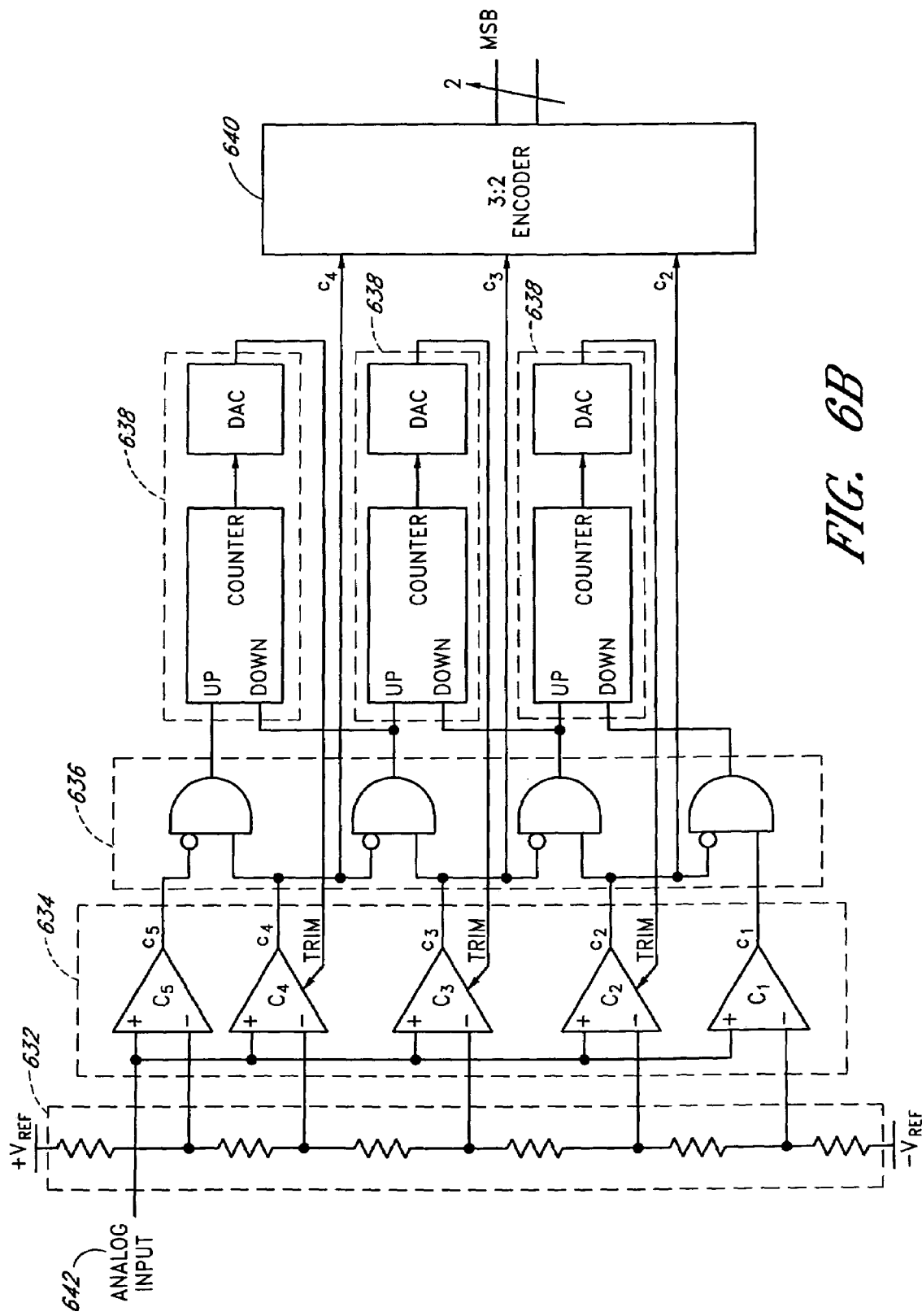
FIG. 6B illustrates an example of a 2-bit ADC according to an embodiment of the invention.

FIG. 6B illustrates an example of a 2-bit ADC according to an embodiment of the invention. The illustrated 2-bit ADC includes a voltage reference circuit 632, a comparator bank 634, logic gates 636, trim adjusting circuits 638, and a 3:2 encoder 640. The voltage reference circuit 632 provides references for the comparator bank 634. An analog input 642 is provided as an input to the comparator bank 634. With N output bits equal to 2, there are $2^N+1$ or 5 comparators in the comparator bank 634, the innermost $2^N-1$ or 3 of which are coupled to the encoder 640 for data. The encoder 640 converts the 3 lines of thermometer coded data (c2, c3, and c4) from the comparator bank 634 to binary format.

The operation of the 2-bit ADC illustrated in FIG. 6B is similar to that of the 1-bit ADC described earlier in connection with FIG. 6A. The outputs (c1–c5) from the comparator bank 634 are used by the logic gates 636 to determine which comparator(s) to adjust and whether to adjust the threshold higher or lower. For example, when the thermometer code of the comparator bank 634 corresponds to {00111} from c5 to c1, the logic gates 636 and the trim adjusting circuits 638 adjust the threshold of comparator C4 lower and adjust the threshold of comparator C3 higher. As described earlier in connection with the trim adjusting circuit 608 of FIG. 6A, the trim adjusting circuits 638 of FIG. 6B can be implemented in a wide variety of ways.

Figure 6C:
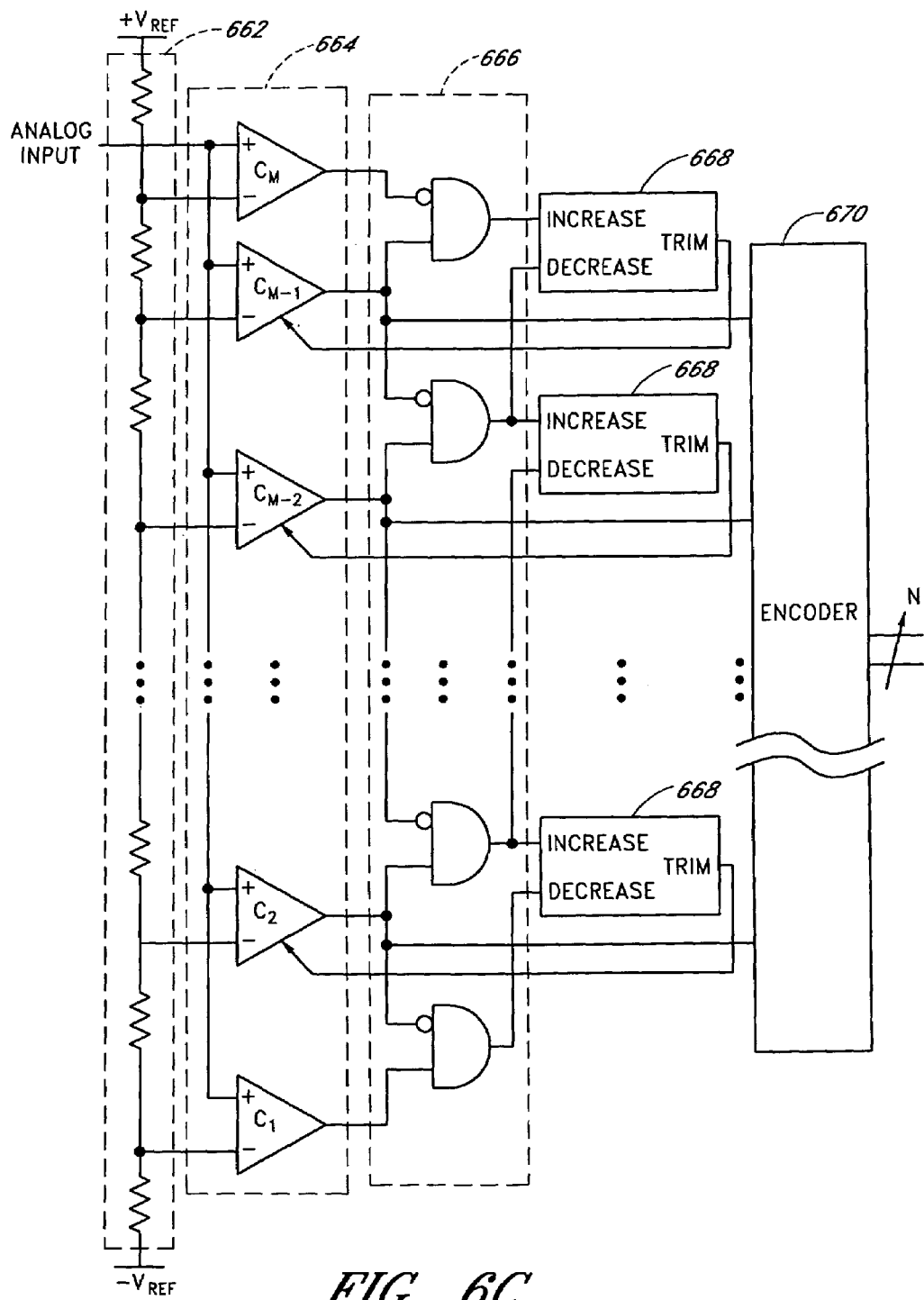
FIG. 6C illustrates an example of a generalized N-bit ADC according to an embodiment of the invention.

FIG. 6C illustrates an example of a generalized N-bit ADC according to an embodiment of the invention. The N-bit ADC includes a voltage reference circuit 662, a comparator bank 664 with M comparators, logic gates 666, trim adjusting circuits 668, and an encoder 670. For N number of binary output bits, the number of comparators M is $2^N+1$ of which $2^N-1$ are threshold adjusted and are used for detection of data. The outermost comparators of the comparator bank 664, i.e., comparator 1 and comparator M, are used for calibration.

Figure 7:
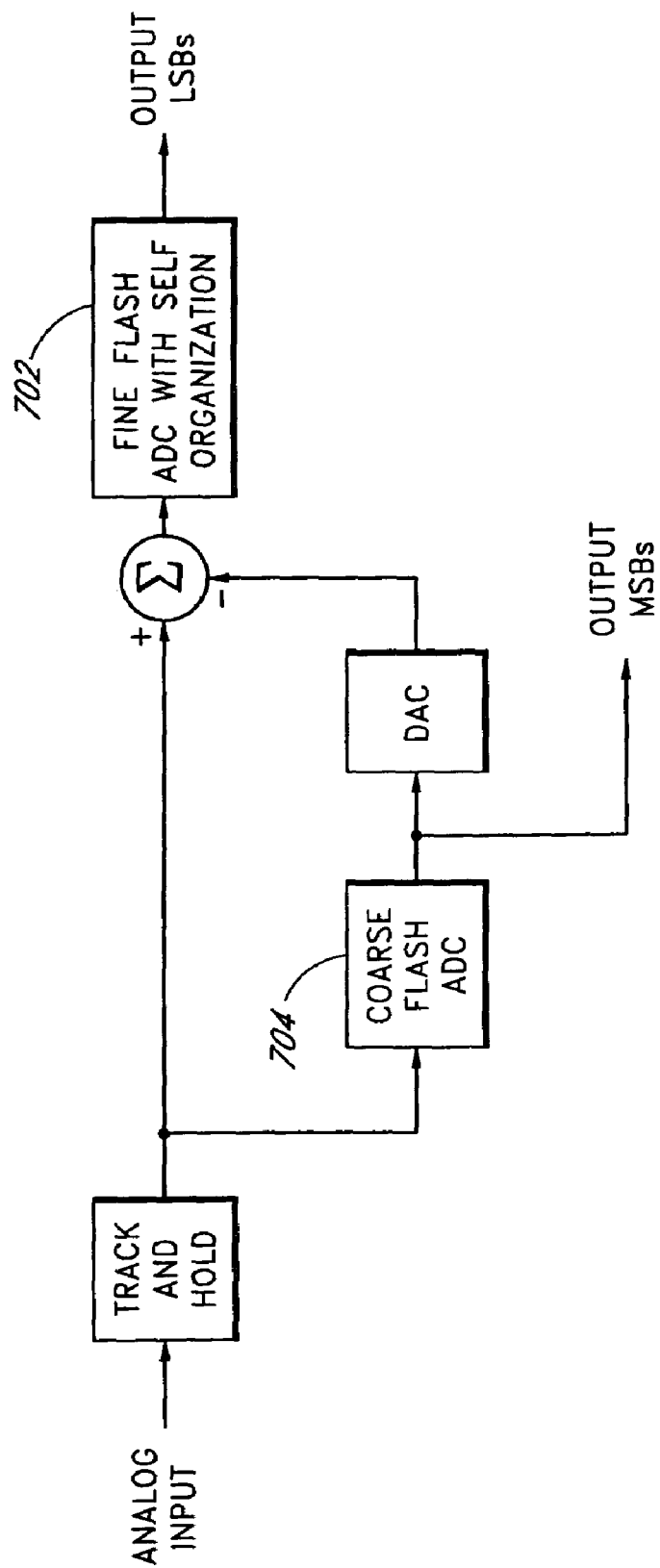
FIG. 7 illustrates a sub-ranging ADC according to an embodiment of the invention.

FIG. 7 illustrates a sub-ranging ADC according to an embodiment of the invention. The illustrated sub-ranging ADC corresponds to a two-stage pipeline. Other configurations for sub-ranging ADCs exist, such as a classic sub-ranging ADC described by Brandt and Lutsky in *A 750 mW, 10-b, 20-MSPS CMOS Subranging ADC with 9.5 Effective Bits at Nyquist*, IEEE Journal of Solid-State Circuits, Vol. 34, No. 12, December 1999, pp. 1788 to 1795. Sub-ranging ADCs are also known as multi-step converters or as half-flash converters. The disclosed self-organizing techniques are compatible with a wide-range of sub-ranging ADCs, including the two-stage pipeline sub-ranging ADC and the classic configuration. In one embodiment, the sub-ranging techniques are used only for the fine Flash ADC 702 and not on the coarse Flash ADC 704. It will be noted that the analog input for the fine Flash ADC 702 has been processed from the analog input signal for the sub-ranging ADC by a summation circuit, which subtracts away a coarse component from the analog input signal.

Figure 8:
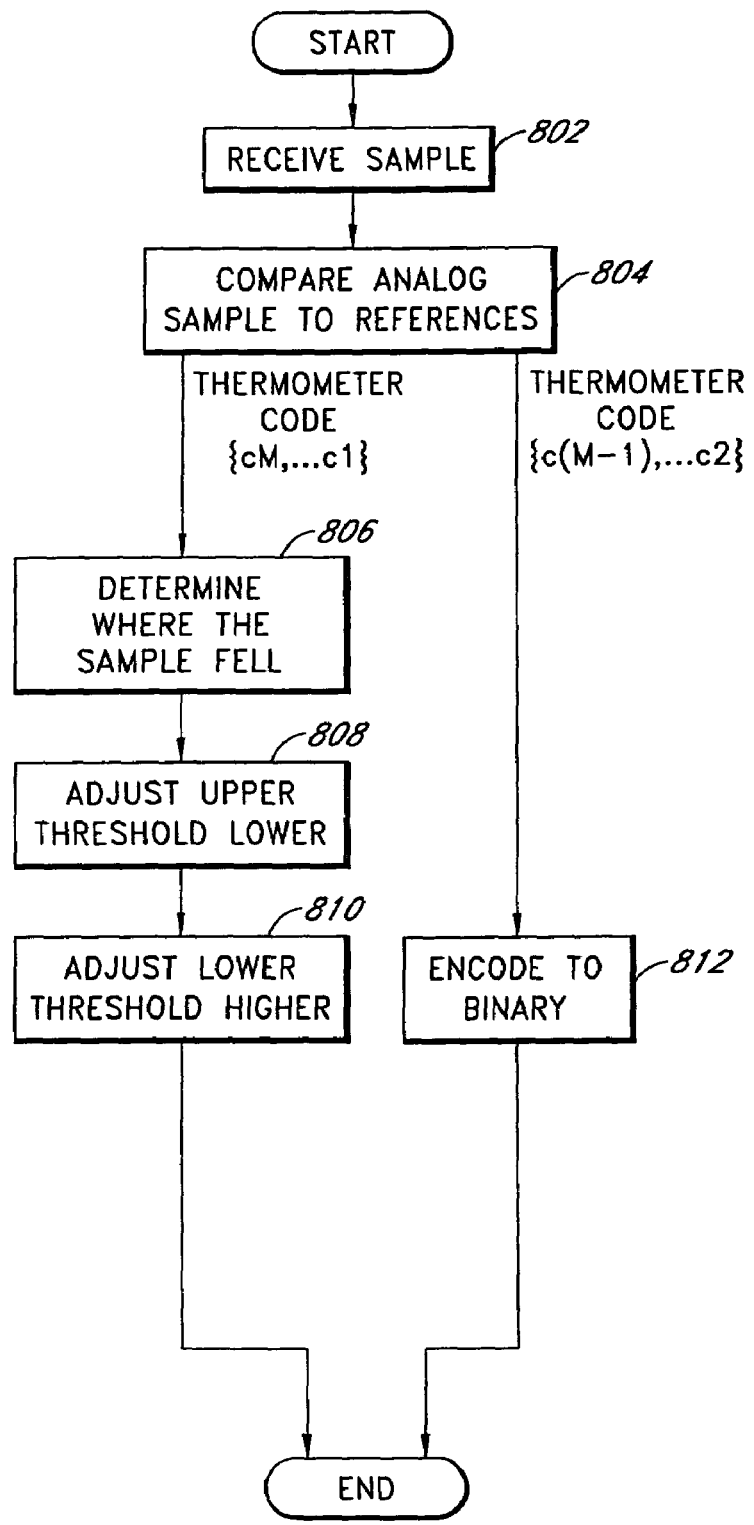
FIG. 8 illustrates a process according to an embodiment of the invention.

FIG. 8 illustrates a process according to an embodiment of the invention. It will be appreciated by the skilled practitioner that the illustrated process can be modified in a variety of ways. For example, in another embodiment, various portions of the illustrated process can be combined, can be rearranged in an alternate sequence, can be removed, and the like.

In a receive state 802, the process receives an analog sample to be converted. For example, a sample and hold circuit or a track and hold circuit can be used to hold steady a particular portion of an analog signal for conversion. It will be understood that the sampling process can be optional and is not necessarily used in all analog-to-digital conversions. For example, where the analog-to-digital conversion process is relatively fast compared to changes in the analog signal, a sample and hold state would not be needed. The term "sample" will be used herein regardless of whether sampling was used or not. The process advances from the receive state 802 to a comparison state 804.

In the comparison state 804, the analog sample is compared to reference voltages. For example, a comparator bank can be used. Typically, the result of the comparison is a thermometer code, which digitally represents the level of the analog sample. For example, when there are N binary output bits and M comparisons to reference voltages, the value of M is typically $2^N+1$ for a Flash ADC. Of course, additional comparisons can be made and discarded, or fewer comparisons can be made for a sub-ranging ADC. The process advances from the comparison state 804 to a determination state 806 for possible adjustment of thresholds and to an encoding state 812, which will be discussed later.

In the determination state 806, the process uses the outputs cM to c1 of the comparators (for the Flash ADC), to determine where the sample fell among the possible thermometer code spaces. The sample will be detected at least between one upper threshold and one lower threshold. The process advances from the determination state 806 to an adjustment state 808.

In the adjustment state 808, the process adjusts the threshold voltage for the upper threshold. The upper threshold is adjusted lower than its previous level, by, for example, adjusting an associated trim level. It will be understood that adjustments do not have to occur each time a sample is received. For example, indications for adjustments can be accumulated before they are used. The process advances from the adjustment state 808 to an adjustment state 810.

In the adjustment state 810, the process adjusts the threshold voltage for the lower threshold. The lower threshold is adjusted higher than its previous level, by, for example, adjusting an associated trim level. These adjustments serve to narrow the voltage range spanned by the identified thermometer code, thereby helping to balance the detection of codes across the set of codes.

Returning now to the encoding state 812, the process encodes the thermometer code to another representation, such as binary code. In one embodiment, the highest and the lowest comparisons are used only for adjustment purposes, so that only a subset of the thermometer coded data, e.g., c(M−1) to c2, are used for encoding. This conversion to binary can save data lines. For example, where N equals 8 bits, then 255 lines indicate the thermometer code for data. The process is then complete for the particular analog-to-digital conversion and can be repeated as desired.

Various embodiments have been described above. Although described with reference to these specific embodiments, the descriptions are intended to be illustrative and are not intended to be limiting. Various modifications and applications may occur to those skilled in the art without departing from the true spirit and scope of the invention as defined in the appended claims.

What is claimed is:

1. An apparatus for adjusting a comparison, the apparatus comprising:

an arrangement of comparators in a thermometer-code configuration, the comparators being configured to receive an analog signal, at least a portion of outputs of comparators carrying a first digital form of the analog signal;

logic circuits configured to make a determination when the analog signal is between levels detected by logically adjacent comparators of the comparator arrangement, wherein a first logic circuit comprises a first "AND" gate with at least a first input and a second input, where the first input of the first AND gate is coupled to an output of a first comparator of the comparator arrangement and the second input of the first AND gate is coupled to an output of a second comparator of the comparator arrangement adjacent to the first comparator, the comparators and the first AND gate being configured such that the first input is effectively inverted with respect to the second input, wherein the first logic circuit is configured to determine when the analog signal is lower than a threshold voltage for the second comparator and is higher than a threshold voltage for the first comparator, wherein the second comparator is higher in the thermometer-code configuration than the first comparator; and a circuit configured to adjust a threshold voltage of at least one of the logically adjacent comparators at least partially in response to the determination by said logic circuit.

2. The apparatus as defined in claim 1, further comprising an encoder configured to encode the first digital form to binary digital data.

3. The apparatus as defined in claim 1, wherein the circuit adjusts threshold voltages for both adjacent comparators.

4. The apparatus as defined in claim 1, wherein the plurality of comparators comprise a sub-ranging analog-to-digital converter with a coarse flash analog-to-digital converter and a fine flash analog-to-digital converter, wherein the one or more adjustment circuits are used only for the fine flash analog-to-digital converter.

5. An apparatus for converting an analog input signal to digital, the apparatus comprising:
a plurality of comparators comprising at least a first comparator, a second comparator, and a third comparator, where one or more of the comparators including at least the second comparator is configured to provide a signal for an analog-to-digital conversion, where each comparator of the plurality has a first input coupled to a voltage reference specific for the comparator and has a second input coupled to an analog signal based at least partially on the analog input signal, wherein the plurality of comparators comprise a flash analog-to-digital converter having N binary output bits, wherein the plurality of comparators amount to $2^N+1$ comparators, where $2^N-1$ comparators provide data lines for the analog-to-digital conversion, where the one or more adjustment circuits amount to $2^N-1$ adjustment circuits, and where the analog input signal comprises the analog signal;
a first logic circuit having a first input, a second input, and an output, where the first input is coupled to an output of the first comparator, the second input is coupled to an output of the second comparator, and the output of the first logic circuit is at least partially responsive to a logical combination of the first input and the second input;
a second logic circuit having a first input, a second input, and an output, where the first input is coupled to an output of the second comparator, the second input is coupled to an output of the third comparator, and the output of the second logic circuit is at least partially responsive to a logical combination of the first input and the second input; and
one or more adjustment circuits for the one or more comparators of the plurality that are configured to provide a signal, the one or more adjustment circuits including at least a first adjustment circuit configured to decrease a threshold of comparison of the second comparator in response to activation at a first input, where the first adjustment circuit is configured to increase the threshold of comparison in response to activation at a second input, and where the first input and the second input are coupled to the first logic circuit and to the second logic circuit, respectively, for activation.

6. The apparatus as defined in claim 5, wherein the one or more data lines comprise a plurality of data lines in thermometer code, where the apparatus further comprises an encoder with inputs coupled to the plurality of data lines, where the encoder is configured to generate a binary-coded digital output.

7. The apparatus as defined in claim 5, where the first logic circuit comprises an AND gate, where at least one input is effectively inverted with respect to another input.

8. The apparatus as defined in claim 5, where the first logic circuit comprises an Exclusive-OR (XOR) gate.

9. The apparatus as defined in claim 5, wherein the plurality of comparators comprises a sub-analog-to-digital converter portion of one or more stages of a pipeline analog-to-digital converter.

10. The apparatus as defined in claim 5, wherein an adjustment circuit comprises an up/down counter and a digital-to-analog converter, where an output of the counter having a count is coupled to an input to the digital-to-analog converter, where the count changes in response to a control at the first input or the second input.

11. The apparatus as defined in claim 5, wherein an adjustment circuit comprises a digital filter and a digital-to-analog converter, where an output of the digital filter is coupled to an input to the digital-to-analog converter, and where the output of the digital filter is configured to change in response to a control at the first input or the second input.

12. The apparatus as defined in claim 5, wherein an adjustment circuit comprises an analog filter or a digital filter coupled to a charge-pump.

13. The apparatus as defined in claim 5, wherein the plurality of comparators comprises a digital communication system.

14. The apparatus as defined in claim 5, wherein the plurality of comparators are arranged in a thermometer-code arrangement, wherein the second comparator is higher in a thermometer-code arrangement than the first comparator, and wherein the first logic circuit is configured to determine when the analog signal is lower than a threshold voltage for the second comparator and is higher than a threshold voltage for the first comparator.

15. An apparatus for converting an analog input signal to digital, the apparatus comprising:
a plurality of comparators comprising at least a first comparator, a second comparator, and a third comparator, where one or more of the comparators including at least the second comparator is configured to provide a signal for an analog-to-digital conversion, where each comparator of the plurality has a first input coupled to a voltage reference specific for the comparator and has a second input coupled to an analog signal based at least partially on the analog input signal, wherein the plurality of comparators comprise a sub-ranging analog-to-digital converter with a coarse flash analog-to-digital converter and a fine flash analog-to-digital converter, wherein the one or more adjustment circuits are used only for the fine flash analog-to-digital converter;
a first logic circuit having a first input, a second input, and an output, where the first input is coupled to an output of the first comparator, the second input is coupled to an output of the second comparator, and the output of the first logic circuit is at least partially responsive to a logical combination of the first input and the second input;
a second logic circuit having a first input, a second input, and an output, where the first input is coupled to an output of the second comparator, the second input is coupled to an output of the third comparator, and the output of the second logic circuit is at least partially responsive to a logical combination of the first input and the second input; and
one or more adjustment circuits for the one or more comparators of the plurality that are configured to provide a signal, the one or more adjustment circuits including at least a first adjustment circuit configured to decrease a threshold of comparison of the second comparator in response to activation at a first input, where the first adjustment circuit is configured to increase the threshold of comparison in response to activation at a second input, and where the first input and the second input are coupled to the first logic circuit and to the second logic circuit, respectively, for activation.

16. The apparatus as defined in claim 15, wherein the plurality of comparators are arranged in a thermometer-code arrangement, wherein the second comparator is higher in a thermometer-code arrangement than the first comparator, and wherein the first logic circuit is configured to determine when the analog signal is lower than a threshold voltage for the second comparator and is higher than a threshold voltage for the first comparator.

17. The apparatus as defined in claim 15, wherein an adjustment circuit comprises an analog filter or a digital filter coupled to a charge-pump.

18. The apparatus as defined in claim 15, wherein the plurality of comparators comprises a digital communication system.

19. A method of adjusting a threshold of a comparator, the method comprising:
converting an input signal from analog to digital with a plurality of comparators arranged in a thermometer-code configuration;
using the analog signal to be converted as an input signal for calibration of at least a portion of the comparators;
determining when the analog signal is between levels detected by logically adjacent comparators of the comparator arrangement, wherein the logically adjacent comparators comprise at least a first comparator and a second comparator, wherein the first comparator is lower in the thermometer-code configuration than the second comparator, and wherein the analog signal is determined to be above a threshold voltage detected by the first comparator and to be below a threshold voltage detected by the second comparator; and
adjusting a threshold voltage of at least one of the adjacent comparators at least partially in response to the determination.

20. The method as defined in claim 19, wherein adjusting further comprises adjusting the threshold voltages for both adjacent comparators, where between the adjacent comparators, the threshold voltage for the second comparator is adjusted down, and where the threshold voltage for the first comparator is adjusted up.

21. The method as defined in claim 19, further comprising encoding outputs of at least a portion of the comparators into binary digital form.

22. A method of calibrating a threshold of a comparator used in an analog-to-digital conversion, the method comprising:
comparing an analog signal to a first reference;
comparing the analog signal to a second reference, where the second reference is higher than the first reference in a thermometer-code arrangement;
comparing the analog signal to a third reference, where the third reference is higher than the second reference in the thermometer-code arrangement;
adjusting the comparison of the analog signal and the second reference such that the second reference is effectively higher for a subsequent comparison at least partially in response to a determination that the analog signal is lower than the third reference and is higher than the second reference;
adjusting the comparison of the analog signal and the second reference such that the second reference is effectively lower for a subsequent comparison at least partially in response to a determination that the analog signal is lower than the second reference and is higher than the first reference;
generating data for the analog-to-digital conversion with at least the comparison of the analog signal with the second reference; and
performing the method in real time.

23. The method as defined in claim 22, wherein generating data for the analog-to-digital conversion further comprises encoding a plurality of data bits from a plurality of comparisons into binary data.

24. The method as defined in claim 22, where the comparison with the third reference is used for a higher-order data bit than the comparison using the second reference.

25. The method as defined in claim 22, wherein the first reference is logically intended to be of lower voltage than the second reference, and the second reference is logically intended to be of lower voltage than the third reference.

26. The method as defined in claim 22, further comprising using a resistor ladder network to at least partially generate the first reference, the second reference, and the third reference.

27. The method as defined in claim 22, wherein a comparison is adjusted by controlling a trimming circuit.

28. The method as defined in claim 22, further comprising performing the method while processing analog-to-digital conversions of the analog signal and without having to interrupt analog-to-digital conversions in order to perform a separate calibration process.

29. The method as defined in claim 22, wherein the method is embodied in a flash analog-to-digital converter.

30. A method of calibrating a threshold of a comparator used in an analog-to-digital conversion, the method comprising:
comparing an analog signal to a first reference;
comparing the analog signal to a second reference;
comparing the analog signal to a third reference;
adjusting the comparison of the analog signal and the second reference such that the second reference is effectively higher for a subsequent comparison at least partially in response to a determination that the analog signal is lower than the third reference and is higher than the second reference;
adjusting the comparison of the analog signal and the second reference such that the second reference is effectively lower for a subsequent comparison at least partially in response to a determination that the analog signal is lower than the second reference and is higher than the first reference;
generating data for the analog-to-digital conversion with at least the comparison of the analog signal with the second reference; and
performing the method in real time;
wherein the method is embodied in a flash analog-to-digital converter, and wherein the flash analog-to-digital converter has N binary output bits and $2^N+1$ comparators for generating comparisons, where the method is used for adjusting comparisons of $2^N-1$ comparators.

31. An apparatus for adjusting a comparison in an analog-to-digital converter, the apparatus comprising:
a plurality of comparators arranged in a thermometer-code configuration to convert an input signal from analog to digital;

means for using the analog signal to be converted as an input signal for adjustment of thresholds of at least a portion of the comparators;

means for determining when the analog signal is between levels detected by adjacent comparators of the comparator arrangement, wherein the logically adjacent comparators comprise at least a first comparator and a second comparator, wherein the first comparator is lower in the thermometer code arrangement than the second comparator, and wherein the analog signal is determined to be above a threshold voltage detected by the first comparator and to be below a threshold voltage detected by the second comparator; and means for adjusting a threshold voltage of at least one of the adjacent comparators at least partially in response to the determination.

32. The apparatus as defined in claim 31, wherein the adjusting means further comprises means for adjusting the threshold voltages for both adjacent comparators, where between the adjacent comparators, the threshold voltage for the second comparator is adjusted down, and where the threshold voltage for the first comparator is adjusted up.

* * * * *